United States Patent
Chen et al.

(10) Patent No.: US 9,575,415 B2
(45) Date of Patent: Feb. 21, 2017

(54) WAFER STAGE TEMPERATURE CONTROL

(71) Applicant: Taiwan Semiconductor Manufacturing Company, Ltd., Hsin-Chu (TW)

(72) Inventors: Li-Jui Chen, Hsinchu (TW); Rui-Cheng Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 189 days.

(21) Appl. No.: 14/285,141

(22) Filed: May 22, 2014

(65) Prior Publication Data

US 2015/0338747 A1 Nov. 26, 2015

(51) Int. Cl.
| | |
|---|---|
| G03B 27/32 | (2006.01) |
| G03B 27/52 | (2006.01) |
| G03B 27/58 | (2006.01) |
| G03F 7/20 | (2006.01) |
| H01L 21/68 | (2006.01) |

(52) U.S. Cl.
CPC ......... G03F 7/70341 (2013.01); G03F 7/2041 (2013.01); G03F 7/70516 (2013.01); G03F 7/70716 (2013.01); G03F 7/70875 (2013.01); *H01L 21/682* (2013.01)

(58) Field of Classification Search
CPC .... G03F 7/20; G03F 7/70341; G03F 7/70516; G03F 7/70716; G03F 7/70875; H01L 21/682

USPC ............................. 310/12.06; 355/30, 72, 77
See application file for complete search history.

(56) References Cited

U.S. PATENT DOCUMENTS

| | | | |
|---|---|---|---|
| 7,675,694 B2 | 3/2010 | Kim et al. | |
| 8,547,521 B1 | 10/2013 | Dakshina-Murthy et al. | |
| 2006/0028627 A1* | 2/2006 | Box | G03F 7/708 355/30 |
| 2006/0033892 A1* | 2/2006 | Cadee | G03F 7/70341 355/30 |
| 2008/0088832 A1* | 4/2008 | Cramer | G01N 21/47 356/237.4 |
| 2008/0275588 A1* | 11/2008 | Wang | G01N 21/9501 700/121 |
| 2012/0120379 A1* | 5/2012 | Phillips | F28F 3/12 355/52 |
| 2013/0094005 A1* | 4/2013 | Kunnen | G03F 7/70875 355/30 |

OTHER PUBLICATIONS

Nagahara et al, "Immersion Effects on Lithography System Performance" Proc. of SPIE vol. 6154, (2006).*

* cited by examiner

*Primary Examiner* — Colin Kreutzer
(74) *Attorney, Agent, or Firm* — Haynes and Boone, LLP

(57) ABSTRACT

A method includes loading a wafer onto a wafer stage of a lithography system, the wafer stage comprising a heating component and a temperature sensing component. The method further includes controlling the heating component such that a temperature of the wafer stage approaches a desired point. The controlling step comprises use of a characterization curve associated with the heating component.

20 Claims, 5 Drawing Sheets

WAFER STAGE TEMPERATURE CONTROL

BACKGROUND

Immersion lithography is a technique sometimes used in semiconductor fabrication processes. Conventional lithography involves exposing a photoresist to a light source through a mask. When forming features at very small sizes, such as the nanometer range, the wavelength of the light from the light source presents a resolution issue. Immersion lithography involves use of an immersion fluid, such as water, placed between the light source and the photoresist. The immersion fluid has an index of refraction that is greater than one and thus allows for a higher resolution pattern. Various improvements are desired with respect to immersion lithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
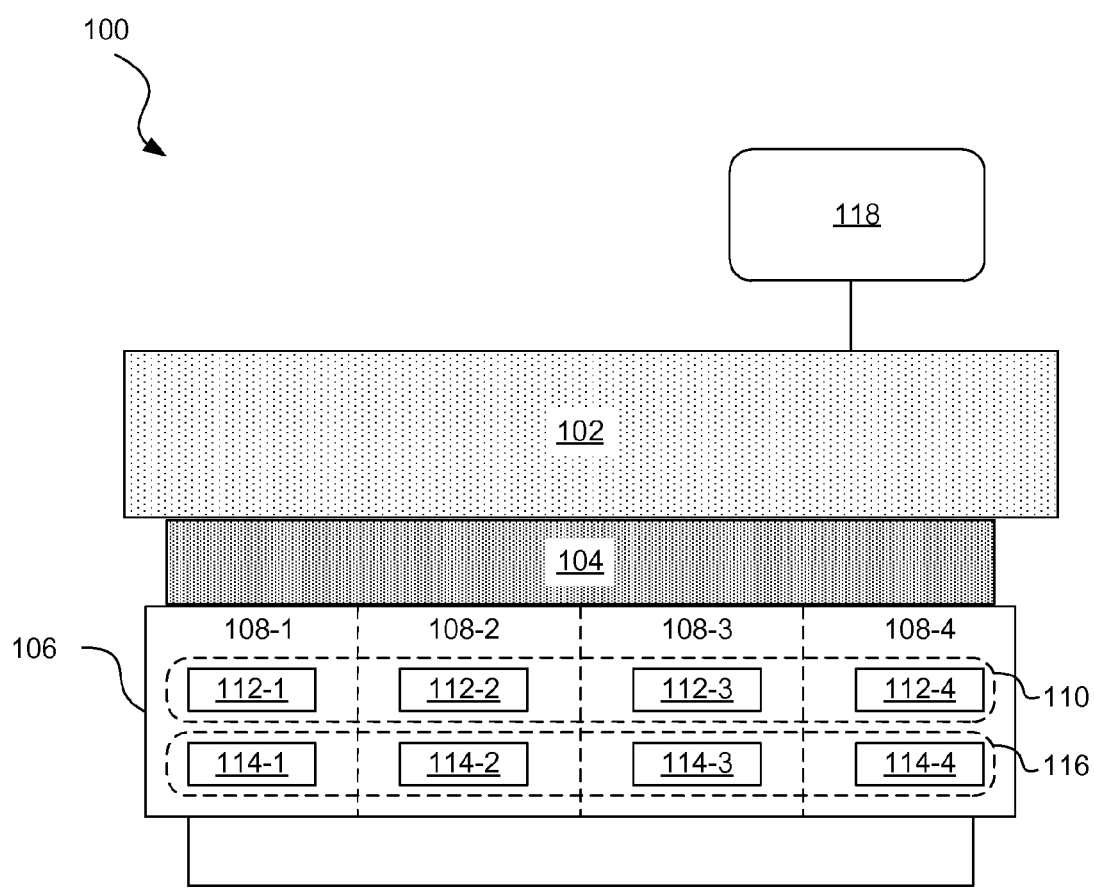
FIG. 1 is a diagram showing an illustrative immersion lithography system having a wafer stage with temperature control, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to increase the efficiency of immersion lithography processing systems. According to principles described herein, the wafer stage of an immersion lithography system includes a number of heating elements associated with different regions of the wafer stage. Each region also includes a temperature sensor. During a calibration stage, the temperature of the wafer stage is measured as the immersion lithography system processes batches of wafers. The measured temperature may be used to determine the ultimate stable temperature point and the characterization curve indicating how the temperature of each heating element approaches that stable temperature point. During a production process, this information can be used to finely control the heating elements to compensate for the temperature differences at the start of processing a new lot. Thus, the production process can proceed without use of a thermal conditioning wafer.

Immersion lithography systems make use of a thermal conditioning wafer for every lot. Because of the heat involved in the lithographic process, some of the immersion fluid is evaporated. The energy change resulting from the evaporation causes temperature changes on the wafer stage that holds the wafers. Wafers are often processed in batches referred to as lots. A single lot may be delivered to the immersion lithography tool by an automated delivery system such as a Front Opening Universal Pod (FOUP) system. Every time a new lot is processed, the thermal conditioning wafer is used to stabilize the temperature of the immersion lithography tool. For example, the thermal conditioning wafer may be a dummy wafer that is used for one or more "dummy" photolithographic processes. Use of the thermal conditioning wafer before every lot gives the immersion lithography system time to stabilize. When the immersion lithography system is inactive for a period of time, such as between lots, the system resets and another thermal conditioning wafer is used before the next lot is processed.

Use of the thermal conditioning wafer takes up valuable production time. For example, it may take 20 to 60 seconds to load the thermal conditioning wafer. It may then take 60 to 120 seconds to perform the conditioning process. This time adds up over several cycles as several lots are processed. Thus, it is desirable to increase the efficiency of immersion lithography processing systems.

FIG. 1 is a diagram showing an illustrative immersion lithography system having a wafer stage with temperature control. According to the present example, the immersion lithography system includes a wafer stage 106, an immersion hood 102, and a control module 118. The wafer stage 106 is designed to support a wafer 104. The immersion hood 102 is designed to be placed adjacent the wafer in order to perform the immersion lithographic processes. Immersion lithographic processes involve an immersion fluid positioned between the wafer 104 and a lens within the immersion hood 102.

The wafer stage 106 is used to support the wafer 104 during the immersion lithographic process. The wafer stage 106 may secure the wafer 104 using a variety of methods. For example, the wafer stage 106 may use a vacuum to secure the wafer 104 to the wafer stage 106. In some examples, the wafer stage 106 uses electrostatic forces to secure the wafer 104 to the wafer stage 106. The wafer stage 106 is typically movable with respect to the immersion hood 102. Thus, during a photolithographic process, the immersion hood 102 moves with respect to the wafer to scan a pattern onto the surface of the wafer 104.

According to principles described herein, the wafer stage 106 includes a heating component 110 and a temperature sensing component 116. The heating component includes a number of heating elements 112. The temperature sensing component 116 includes a number of temperature sensors 112. Additionally, the wafer stage includes a number of regions 108. Each region 108 corresponds to a heating element 112 and a temperature sensor 114-1. For example, region 108-1 includes heating element 112-1 and temperature sensor 114-1. Region 108-2 includes heating element 112-2 and temperature sensor 114-2. Region 108-3 includes heating element 112-3 and temperature sensor 114-3. Region 108-4 includes heating element 112-4 and temperature sensor 114-4. A region does not necessarily correspond to a portion of the wafer stage 106 within specific boundaries. Rather, a region 108 may refer to the general area near a heating element 112 and temperature sensor 114 combination.

For illustrative purposes, only four regions 108 are shown. It is understood that a practical wafer stage 106 may include a much larger number of regions, each region having a corresponding heating element and temperature sensor. Furthermore, while the temperature sensor is illustrated below the heating element, other arrangements are contemplated. For example, the temperature sensors 114 may be closer to the surface of the wafer stage 106 than the heating elements. In some examples, the heating elements and the temperature sensors 114 may be side-by-side. The heating elements 112 and corresponding temperature sensors 114 may be placed throughout the wafer stage 106 according to various patterns. In general, it is desirable that the heating elements are positioned such that they are capable of heating a wafer 104 secured to the wafer stage 106 in a relatively uniform manner.

Each of the heating elements may exhibit fine control. Specifically, the temperature of the heating elements may be controlled by increments of about one milli-kelvin. In some examples, the heating elements may be controlled in increments less than a milli-kelvin. Each individual heating element 112 may be independently controlled. This allows for dynamic control across the wafer stage to allow equal heating across the wafer stage 106. The heat from each of the heating elements 112 will transfer to the wafer 104. Thus, the heating elements can be used to maintain a consistent temperature across the wafer. This is desirable because differences in temperature can cause the wafer 104 to warp. Warping of the wafer 104 can lead to overlay issues and depth of focus issues during the photolithographic processes. For example, when processing several wafers, a subset of which are processed at different temperature, subsequent processes intended to be applied similarly to all wafers will interact differently with wafers previously processed at different temperatures. This leads to overlay or misalignment issues.

The temperature sensors 114 allow for measurement of the temperature of the wafer stage 106 near respective heating elements 112. For example, the temperature sensors 114 can measure the actual temperature of the regions 108 around the heating elements under various conditions. The temperature of the wafer stage 106, and thus the wafer 104 as well, changes over time. Specifically, as the immersion fluid evaporates, the temperature of the wafer 104 and wafer stage 106 will be reduced until it approaches a stable point for each batch of wafers. As will be described in further detail below, measurements from the temperature sensors 114 can be used to construct a model. The model may be used during photolithographic processes to stabilize the temperature of the wafer 104 and wafer stage 106 without use of a thermal conditioning wafer.

The wafer 104 may be a standard semiconductor wafer. For example, the wafer may be approximately 300 millimeters in diameter and less than one millimeter thick. The wafer 104 may be made of a semiconductor material such as silicon. The wafer may have a photoresist layer disposed on top. The photoresist layer may have been deposited onto the wafer 104 by a different tool before arriving at the immersion lithography tool.

The immersion hood 102 makes contact with the wafer 104. The immersion hood 102 also provides an immersion fluid that contacts the wafer 104 and fills the space between the wafer 104 and a projection lens. Thus, light from the light source passes from the projection lens directly onto the photoresist layer of the wafer 104. Because the index of refraction of the immersion fluid is greater than one, a better resolution can be achieved. For example, using water as an immersion fluid, a 30-40 percent increase in resolution may be achieved. As the immersion hood 102 moves along the surface of the wafer 104, air knifes may be used to keep the immersion fluid from leaking from the space between the wafer 104 and the projection lens.

As the immersion hood 102 moves along the surface of the wafer 104, the heat from the photolithographic process will cause evaporation of the immersion fluid. Additionally, the environmental humidity difference caused by the photolithographic process will cause evaporation of the immersion fluid. This will reduce the temperature of the wafer 104, and in turn, the temperature of the wafer stage 106. Thus, each subsequent photolithographic process performed on a series of wafers reduces the temperature of the wafer stage 106 until the wafer stage 106 approaches a stable temperature. Thus, as described above, conventional immersion photolithography systems utilize a thermal conditioning wafer for the first few exposures processes until the wafer stage temperature approaches the stable temperature point. The thermal conditioning wafer has to be used for each lot of wafers that is processed. This increases the overall processing time.

Figure 2:
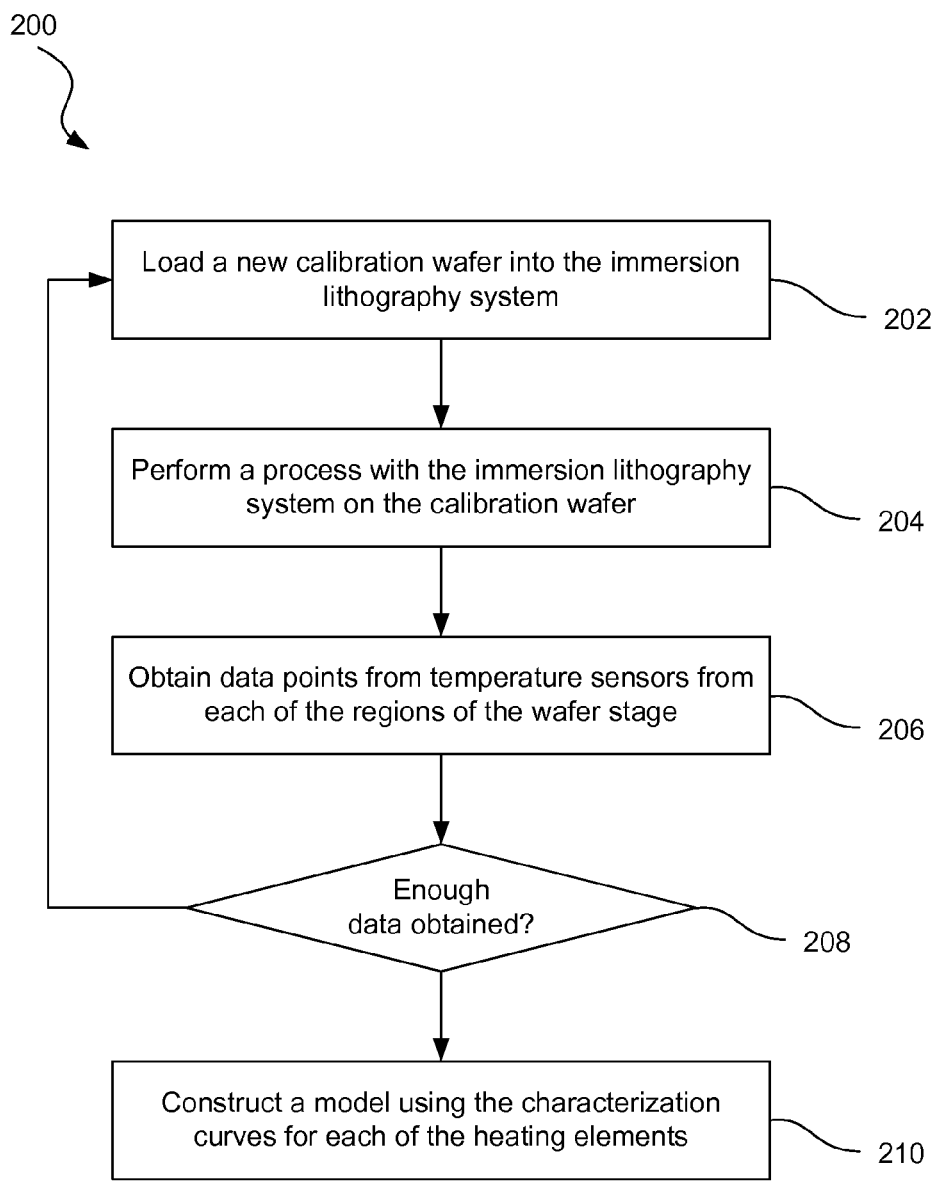
FIG. 2 is a flowchart showing an illustrative process for calibrating an immersion lithography system, according to one example of principles described herein.

FIG. 2 is a flowchart showing an illustrative process for calibrating an immersion lithography system. The calibration process may be performed occasionally to obtain a heater profile for each heating element of the wafer stage. For example, the calibration process can be performed once per day, once per week, or once per month, as seen fit by an operator of the immersion photolithographic system.

According to the present example, the calibration process 200 includes a step 202 for loading a new calibration wafer into the immersion lithography system. The calibration wafer may be a thermal conditioning wafer, which is essentially a dummy wafer. Additionally, the calibration wafer may be a standard production wafer.

The process 200 further includes a step 204 for performing a lithographic process with the immersion lithography system on the calibration wafer. As described above, this process causes a drop in temperature of the wafer stage until the wafer stage approaches a stable point.

The process 200 further includes a step 206 for obtaining data points from the temperature sensor for each of the regions of the wafer stage. In some examples, the data points may be taken several times during a single lithographic process. For example, a data point may be taken for every second or sub-second of a 10-20 second lithographic process. The data points allow for a characterization curve to be obtained for each region of the wafer stage over successive applied lithographic processes.

At step 208, it is determined whether enough data points have been obtained. If enough data points have not been obtained, then the process 200 returns to step 202, wherein a new calibration wafer is loaded, a new lithographic process is performed, and a new set of data points for each region of the wafer stage is obtained. When it is determined that enough data has been obtained, the process 200 proceeds to the next step. Different mechanisms can be used for determining whether enough data has been obtained. In one example, it may be determined that enough data points have been obtained when a fixed number of data points have been obtained. For example, the fixed number may be 30. In some examples, it may be determined that enough data points have been obtained when the data points indicate a sufficiently stable temperature.

At step 210, a model is constructed using the characterization curves formed from the data points obtained for each of the heating elements. As will be described in further detail below, this model is used to mimic the thermal conditioning process so that the wafer stage can approach a thermal state without use of the thermal conditioning wafer.

Figure 3:
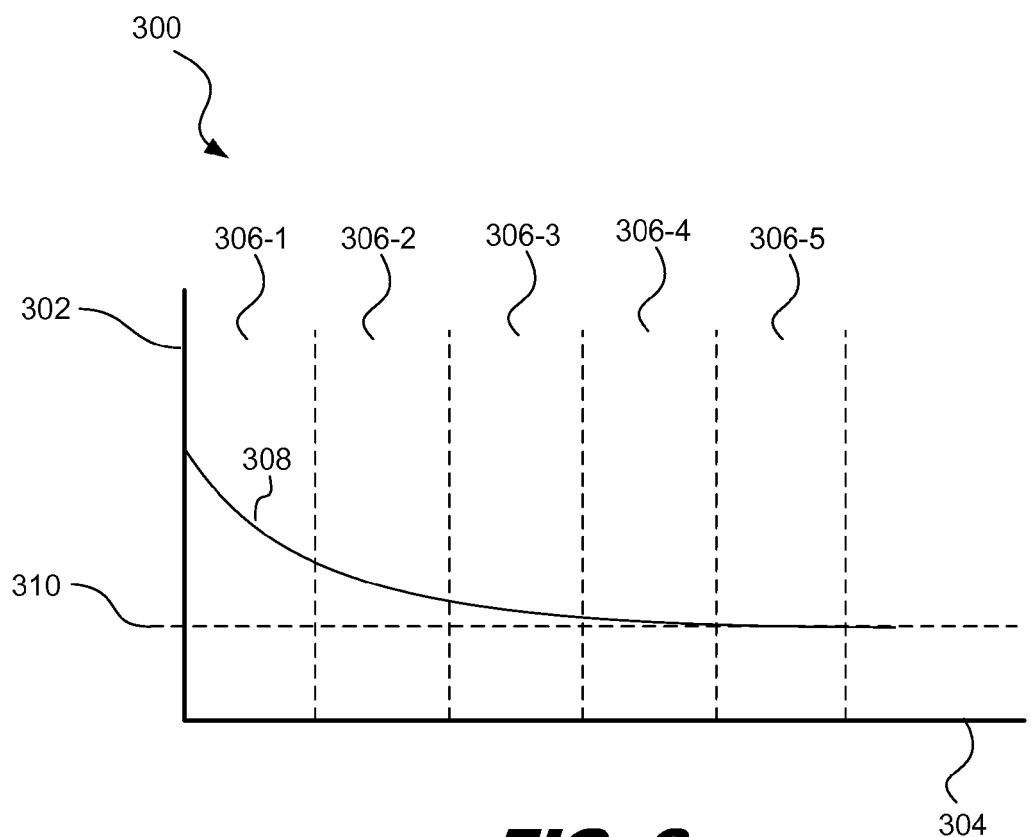
FIG. 3 is graph showing an illustrative characterization curve for a heating element, according to one example of principles described herein.

FIG. 3 is graph showing an illustrative characterization curve for a heating element. In the present example, the vertical axis 302 represents temperature. The horizontal axis 304 represents time. The graph 300 is divided into four different periods 306. Each period 306 corresponds to a lithographic process performed by the immersion lithography system. The characterization curve 308 represents a combination of several data points as will be described in further detail below.

During the first period 306-1, the characterization curve indicates a relatively sharp drop in temperature. The change in temperature continues to get smaller through periods 306-2, 306-3 and 306-3. At period 306-5 the temperature of the wafer stage approaches a stable point 310. In conventional systems, the thermal conditioning wafer is used for the first few periods in order to get the temperature closer to the stable point 310. According to principles described herein, the temperature of each of the heating elements can be controlled to compensate for the initially higher temperatures. Specifically, a different level of power is applied to each of the heating elements during the first few periods so that the actual temperature of the wafer is closer to the stable point 310. Thus, each lot can be processed with the immersion lithography tool without use of the thermal conditioning wafer, and the first few wafers of each lot will not be obscured due to the different temperatures.

Figure 4:
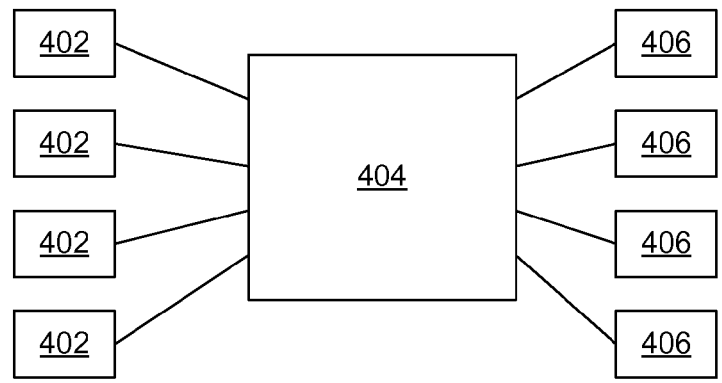
FIG. 4 is a diagram showing an illustrative model used to obtain a characterization curve, according to one example of principles described herein.

FIG. 4 is a diagram showing an illustrative model used to cause a wafer stage to be at a stable temperature at the start of processing a lot. The data points obtained from the calibration wafers are used as inputs 402 into a model creation function 404. The model creation function 404 then produces a set of outputs 406 corresponding to each of the heating elements. Thus, the power level for each of the heating elements of a heating component can be controlled so as to cause the temperature of the wafer stage to approach a desired point. The desired point corresponds to the stable point determined from the characterization curves of each of the heating elements.

The model creation function 404 may use a variety of techniques to determine the appropriate outputs 406 to cause the desired wafer stage temperature. In one example, the model creation function 404 uses a linear Multiple Input Multiple Output (MIMO) regression model. In some examples, the model creation function 404 uses a non-linear MIMO model, such as a neural network model. The model creation function 404 may use a variety of other machine learning techniques as well.

Figure 5:
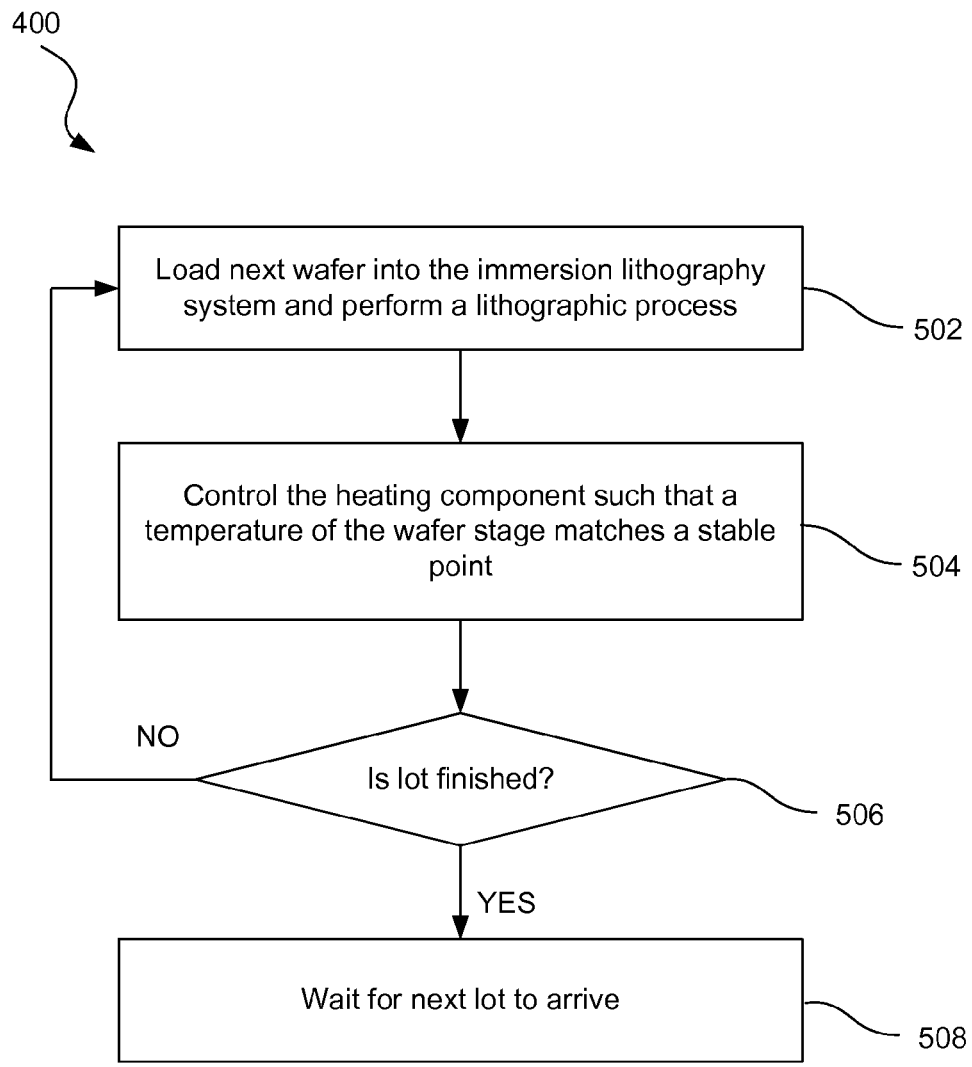
FIG. 5 is a diagram showing an illustrative process for using an immersion lithography system without a thermal conditioning wafer, according to one example of principles described herein.

FIG. 5 is a diagram showing an illustrative process for using an immersion lithography system without a thermal conditioning wafer. This process makes use of the model created from the data points obtained during the calibration process. Use of the model allows an immersion lithography system to carefully control the wafer stage temperature so that it starts out at a stable point at the start of each lot. Therefore, no thermal conditioning wafer is used.

According to the present example, at step 502, the next wafer is loaded into the immersion lithography system. This wafer may be the first wafer in a lot, or a subsequent wafer in the lot. The wafer is a standard production wafer and may be loaded using standard techniques. For example, a robotic arm may extract the wafer from a FOUP used to deliver the lot. The robotic arm may then place the wafer on the wafer stage. The wafer stage may then secure the wafer in place using various techniques. For example, the wafer stage may use a vacuum. Or, the wafer stage may use electrostatic forces to secure the wafer.

After the wafer has been successfully loaded, a lithographic process is performed. The lithographic process is a standard immersion lithographic process. Particularly, the immersion hood moves across the surface of the wafer and exposes the surface to a light source through a mask. As described above, the heat involved with the photolithographic process may cause some of the immersion fluid to evaporate. This results in a loss of thermal energy which reduces the temperature of the wafer and the wafer stage.

According to the present example, at step 504, the heating component is controlled so that the temperature of the wafer stage matches the desired point corresponding to the stable point. This is done using the model created specifically for the outputs. Specifically, for each heating element of the heating component, the power level is controlled so that the actual wafer stage temperature approaches the stable point. A temperature that approaches the stable point is within a threshold range of the stable point. For example, if the stable point is at 295.5 kelvins, then it can be said that the temperature point sufficiently approaches the stable point when it is within a range of about 295.4 kelvins and 295.6 kelvins. Other ranges for when a temperature point is sufficiently close to the stable point are contemplated.

For example, as described earlier, the initial temperature of the wafer stage is higher than the stable point when the immersion lithography system first begins processing a new lot. This temperature drops over time as the lithography process causes evaporation of the immersion fluid. To compensate for this, the power level of the heating elements is lower than normal at first. The power level can then be increased in time according to the model.

At step 506, it is determined whether the lot is done. For example, there may be 25 lots in a wafer. If the recently processed wafer in the lot was not the last wafer in the lot, then more wafers are to be processed. Thus, the process 500 returns to step 502, where the next wafer is loaded, and the lithographic process is performed. At step 504, the heating elements are controlled. Because the temperature of the wafer stage was affected by the lithographic process for the previous wafer, the power level applied to the heating elements will be different during successive iterations. Towards the end of a lot, there may be less variation in power levels because the temperature of the wafer stage is naturally at a more stable point.

When the lot is finished, the immersion lithography system may be put on hold until the next lot arrives. Thus, at step 508, the immersion lithography system waits for the next lot. The next lot may be delivered by a FOUP. There may be a small delay between the processing of wafers from different FOUPs. Specifically, it takes time to move one FOUP away from the immersion lithography tool and more time to bring the next FOUP to the immersion lithography tool. This time delay is generally long enough to put the temperature of the wafer stage outside of the stable range. Thus, as the next lot is processed the heating elements are controlled according to the model to keep the initial temperature closer to the stable point.

In some examples, additional data points may also be obtained during the production process. These additional data points may be used to tune the model or further adjust the power levels of the heating elements during subsequent cycles. These additional data points may be obtained in the same manner as described above.

Figure 6:
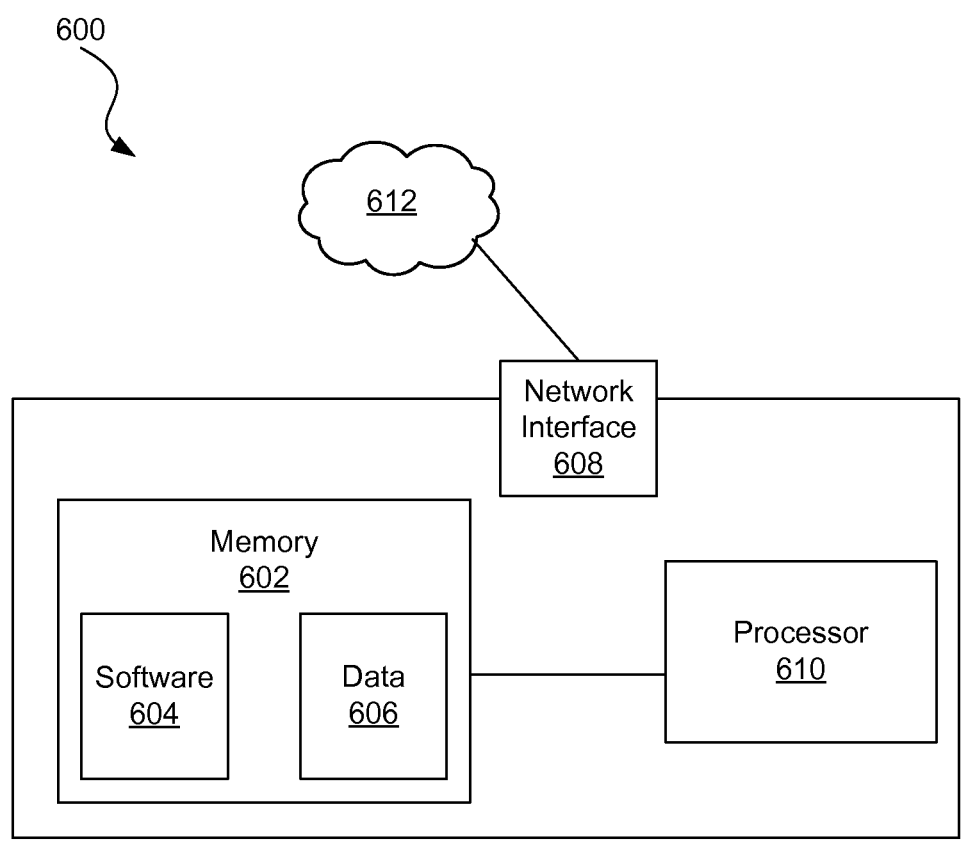
FIG. 6 is a diagram showing an illustrative control module for an immersion lithography system, according to one example of principles described herein.

FIG. 6 is a diagram showing an illustrative control module for an immersion lithography system. The control module 600 may be the same as control module 118 illustrated in FIG. 1. In general, the control module 600 is responsible for managing operations of the immersion lithography system.

According to certain illustrative examples, the control module 600 includes a memory 602 having software 604 and data 606 stored thereon. The control module 600 also includes a processor 610 and a network interface 608. The network interface 608 may connect to other devices over a network 612 such as a Local Area Network (LAN) that is operated and managed by the same entity that manages the immersion lithography system.

There are many types of memory available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software 604 and data 606.

The control module 600 also includes a processor 608 for executing the software 604 and using or updating the data 606 stored in memory 602. The software 604 may include an operating system used to operate the processes associated with the immersion lithography system. Additionally, the software 604 may include an immersion lithography management application. The immersion lithography management application may control the hardware components of the immersion lithography system. For example, the immersion lithography management application may send command instructions to the robotic arms to load and unload wafers. Additionally, the immersion lithography management application may send commands to the immersion hood to move in accordance with a predefined pattern to expose the wafers properly.

The immersion lithography management application may also determine when to apply the calibration function described above in accordance with the text accompanying FIG. 2. For example, the immersion lithography management application may apply the calibration process at regular intervals, such as once per week, or once per month. In some cases, the immersion lithography management application may apply the calibration process only when instructed by a human operator. The immersion lithography management application may also determine when to apply the production process as described above in accordance with the text accompanying FIG. 5.

The software 604 may also include the modeling application used to determine the appropriate outputs for each heating element within the heating component. Specifically, the modeling application may perform the processes described above in accordance with the text accompanying FIG. 4.

The data 606 may include the data points obtained during the calibration process. Specifically, the data 606 may include temperature measurements of the different regions of the wafer stage at various time intervals during several lithographic processes. These data points are then used by the modeling application to determine the appropriate outputs to apply to the heating elements during the production process.

The data 606 may also include the appropriate outputs for each of the heating elements of a heating component. These outputs change over time for each lot cycle. Specifically, during the first few lithographic processes of a lot, there may be more output variation to account for the initial temperature difference before the system causes the wafer stage to reach a more stable temperature.

Use of the system and methods described herein allows for more efficient fabrication of semiconductor devices using immersion lithography. Specifically, batches of wafers can be processed without the use of a thermal conditioning wafer. This allows more time for production and does not cause unwanted overlay and focusing issues between different batches of wafers.

According to one example, a method includes loading a wafer onto a wafer stage of a lithography system, the wafer stage comprising a heating component and a temperature sensing component. The method further includes controlling the heating component such that a temperature of the wafer stage approaches a desired point. The controlling step comprises use of a characterization curve associated with the heating component.

According to one example, a method includes loading a wafer onto a wafer stage of a lithography system, the wafer stage comprising a heating component comprising a number of heating elements, the wafer stage further comprising a temperature sensing component comprising a number of temperature sensors, each of the temperature sensors corresponding to one of the heating elements. The method further includes adjusting a power applied to the heating elements to cause a temperature of the wafer stage at regions corresponding to each of the heating elements to reach a desired point. The controlling step comprises use of a characterization curve associated with each of the heating elements of the heating component.

A lithography system includes a wafer stage comprising a number of regions, each region comprising a heating element, and a temperature sensor. The lithography system further includes a control module comprising a processor and a memory comprising machine readable instructions that when executed by the processor, cause the system to load a wafer onto a wafer stage and adjust a power applied to the heating elements to cause a temperature of the wafer stage at the regions corresponding to each of the heating elements to reach a desired point. To adjust the power, a characterization curve associated with each of the heating elements is used.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    loading a wafer onto a wafer stage of a lithography system, the wafer stage comprising a heating component and a temperature sensing component arranged such that within each of a plurality of regions of the wafer, there is both a heating element and a temperature sensor positioned below the heating element;
    controlling the heating component such that a temperature of the wafer stage approaches a desired point;
    wherein the controlling comprises use of a characterization curve associated with the heating component based, at least in part, on a sequence of calibration wafers previously loaded in the lithography system.

2. The method of claim 1, wherein obtaining the characterization curve for the heating component comprises:
    loading the sequence of calibration wafers into the lithography system;
    performing a lithographic process with the lithography system on each of the calibration wafers;
    during the lithographic processes, obtaining data points associated with a measured temperature of the wafer stage; and
    using the data points to create a characterization curve for the heating component.

3. The method of claim 2, wherein the calibration wafers comprise at least one of: a dummy wafer or a production wafer.

4. The method of claim 2, further comprising using a linear regression model to determine a power level for the heating component to cause the heating component to approach the desired point.

5. The method of claim 2, further comprising, using a non-linear model to determine a power level for the heating component to cause the heating component to approach the desired point.

6. The method of claim 2, wherein obtaining the characterization curve is performed at specified time intervals.

7. The method of claim 6, wherein the specified time intervals comprise one of: a day, a week, or a month.

8. The method of claim 1, wherein the heating component is controllable in increments less than a milli-kelvin.

9. The method of claim 1, wherein the heating component comprises a number of heating elements positioned throughout the wafer stage.

10. The method of claim 9, wherein the temperature sensing component comprises a number of temperature sensors, each temperature sensor corresponding to one of the heating elements.

11. The method of claim 1, wherein the desired point comprises a stable temperature point exhibited by the wafer stage after a series of processes performed by the lithography system.

12. A method comprising:
    loading a wafer onto a wafer stage of a lithography system, the wafer stage comprising a heating component comprising a plurality of heating elements, the wafer stage further comprising a temperature sensing component comprising a plurality of temperature sensors, each of the temperature sensors corresponding to a different one of the heating elements, the temperature sensing component positioned below the heating component;
    adjusting a power applied to the heating elements to cause a temperature of the wafer stage at regions corresponding to each of the heating elements to reach a desired point;
    wherein the controlling comprises use of a characterization curve associated with each of the heating elements of the heating component.

13. The method of claim 1, wherein the desired point corresponds to a stable temperature point after performing a number of lithographic processes with the lithography system.

14. The method of claim 12, wherein the characterization curve for each of the heating elements comprises:
    loading a sequence of calibration wafers into the lithography system;
    performing a lithographic process with the lithography system on each of the calibration wafers;
    during the lithographic processes, obtaining data points associated with measured temperatures from each of the temperature sensors corresponding to the heating elements.

15. The method of claim 14, wherein the calibration wafers comprise at least one of: a dummy wafer or a production wafer.

16. The method of claim 14, further comprising using one of: a linear regression model or a neural network model to determine a power level for the heating component to cause the heating component to approach the desired point.

17. The method of claim 1, wherein the heating component is controllable in increments less than a milli-kelvin.

18. A lithography system comprising:
    a wafer stage comprising a plurality of regions, each region comprising:
        a heating element; and
        a temperature sensor positioned below the heating element; and
    a control module comprising:
        a processor; and
        a memory comprising machine readable instructions that when executed by the processor, cause the system to:
        load a wafer onto the wafer stage; and
        adjust a power applied to the heating elements to cause a temperature of the wafer stage at the regions corresponding to each of the heating elements to reach a desired point;
    wherein to adjust the power, a characterization curve associated with each of the heating elements is used.

19. The system of claim 18, wherein to obtain the characterization curves, the machine readable instructions further cause the system to:
    load a sequence of calibration wafers into the lithography system;

perform a lithographic process with the lithography system on each of the calibration wafers;

during the lithographic processes, obtain data points associated with measured temperatures from each of the temperature sensors corresponding to the heating elements; and use a model to determine appropriate outputs for the heating elements, the model being based on the data points.

20. The system of claim 18, wherein the desired point corresponds to a stable temperature point after performing a number of lithographic processes with the lithography system.

* * * * *